United States Patent
Manning

(10) Patent No.: US 6,600,359 B1
(45) Date of Patent: Jul. 29, 2003

(54) CIRCUIT HAVING A LONG DEVICE CONFIGURED FOR TESTING

(75) Inventor: Troy A. Manning, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/433,513

(22) Filed: Nov. 3, 1999

Related U.S. Application Data

(60) Continuation of application No. 09/164,195, filed on Sep. 30, 1998, now Pat. No. 6,107,111, which is a division of application No. 08/760,153, filed on Dec. 3, 1996, now Pat. No. 5,859,442.

(51) Int. Cl.⁷ .................... H01H 37/76; H01L 23/58; G01R 31/08
(52) U.S. Cl. .................... 327/404; 257/48; 324/523
(58) Field of Search ................ 324/523, 512, 324/522, 527; 257/48; 327/365, 389, 408, 403, 404

(56) References Cited

U.S. PATENT DOCUMENTS

| | | | | |
|---|---|---|---|---|
| 4,609,833 A | * | 9/1986 | Guterman | |
| 5,286,656 A | * | 2/1994 | Keown et al. | |
| 5,307,010 A | * | 4/1994 | Chiu | |
| 5,323,350 A | * | 6/1994 | McLaury | |
| 5,339,277 A | * | 8/1994 | McClure | |
| 5,341,336 A | * | 8/1994 | McClure | |
| 5,424,988 A | * | 6/1995 | McClure | |
| 5,444,366 A | * | 8/1995 | Chiu | |
| 5,504,369 A | * | 4/1996 | Dasse et al. | |
| 5,504,389 A | | 4/1996 | Dickey | |
| 5,532,614 A | * | 7/1996 | Chiu | |
| 5,592,736 A | * | 1/1997 | Akram et al. | |
| 5,619,462 A | * | 4/1997 | McClure | |
| 5,619,482 A | | 4/1997 | Tezuka et al. | |
| 5,657,266 A | | 8/1997 | McLaury | |
| 5,727,001 A | | 3/1998 | Loughmiller | 371/28 |
| 5,742,555 A | | 4/1998 | Marr et al. | 365/225.7 |
| 5,796,266 A | * | 8/1998 | Wright et al. | |
| 5,818,251 A | * | 10/1998 | Intrater | |
| 5,859,442 A | | 1/1999 | Manning | |
| 6,107,111 A | | 8/2000 | Manning | |
| 6,133,053 A | | 10/2000 | Wright et al. | |

FOREIGN PATENT DOCUMENTS

| | | | |
|---|---|---|---|
| EP | 305935 | 3/1989 | ........... H01L/27/02 |
| JP | 04-333252 | 11/1992 | |
| JP | 4-333252 A | * 11/1992 | |

* cited by examiner

Primary Examiner—Evan Pert
(74) Attorney, Agent, or Firm—Charles Brantley

(57) ABSTRACT

An integrated device includes a redundant bond pad for accessing internal circuitry in the event that the main bond pad for that circuitry is difficult to access with testing equipment. Signals from the redundant bond pad are biased to ground during normal operations of the integrated device. In order to test the relevant internal circuitry, a voltage is applied to a Test Mode Enable bond pad, overcoming the bias that grounds the redundant bond pad. In addition, the signal from the Test Mode Enable bon pad serves to ground any transmission from the main bond pad. As a result, the bond pad may be used to test the relevant internal circuitry given its accessible location in relation to the testing equipment.

11 Claims, 8 Drawing Sheets

CIRCUIT HAVING A LONG DEVICE CONFIGURED FOR TESTING

RELATED APPLICATIONS

This application is a continuation of U.S. application Ser. No. 09/164,195, filed on Sep. 30, 1998 and issued as U.S. Pat. No. 6,107,111; which is a divisional of U.S. application Ser. No. 08/760,153, filed Dec. 3, 1996, and issued as U.S. Pat. No. 5,859,442.

TECHNICAL FIELD

The present invention relates generally to electronic devices and, more specifically, to a circuit for providing a redundant bond pad for probing semiconductor devices.

BACKGROUND OF THE INVENTION

As seen in FIG. 1, one or more dies are formed in a conventional manner on a wafer which, in turn, is formed from a semiconductor material such as silicon. Each die has an integrated circuit or device that has been formed but not yet detached from the wafer. Further, each die on the wafer can be tested by placing a set of mechanical probes in physical contact with the die's bond pads. The bond pads provide a connection point for testing the integrated circuitry formed on the die. The probes apply voltages to the input bond pads and measure the resulting output electrical signals on the output bond pads. Not all bond pads on a die, however, are easily accessible by these devices. Given the dies' arrangement in FIG. 1, for example, it is generally easier to probe the long sides of the die; the short sides of the die are usually too close to the other dies to allow sufficient clearance for testing purposes. Thus, it can be difficult to test circuits that are coupled to an inaccessible bond pad.

Requiring bond pads to be located only in the areas accessible during testing may lead to inefficient and complex circuit layouts. One known solution, as shown in FIG. 3, is to attach another bond pad, one that can be reached by a testing device, to the same wire used by the original bond pad. This solution, however, tends to increase the input capacitance. Attempts at minimizing this capacitance will result in the use of more die space.

A second known solution is to multiplex (mux) two input buffers together, as illustrated in FIG. 4, once again allowing an testable bond pad to access circuitry. With this mux circuit, however, signals from the original pad take longer to reach the die's integrated circuitry. In addition, if input is designed to be received from multiple input buffers in a parallel configuration, this muxing solution would require duplicating large portions of the input circuitry, once again taking up a great deal of die space.

SUMMARY OF THE INVENTION

The present invention provides a circuit allowing an alternate access point to be used in testing the integrated circuitry, wherein the circuitry is usually accessed at another point that is difficult to reach with testing equipment The resulting advantage of this implementation is that the circuit may be easily tested As another advantage, the circuit may operate during testing at the same polarity input as used in normal operations of the die without an increase in capacitance. Moreover, the preferred embodiments of this invention may be used to test the circuit without appreciably slowing down the time to input signals. Further, the invention will not require the duplication of circuitry related to the input of data. For purposes of testing in one preferred implementation, the circuit also prevents the use of an input pad employed during normal operation.

BRIEF DESCRIPTION OF THE DRAWINGS

FIG. 6b is a more detailed schematic diagram of the exemplary embodiment in FIG. 6a.

DETAILED DESCRIPTION OF THE PREFERRED EMBODIMENTS

Figure 1:
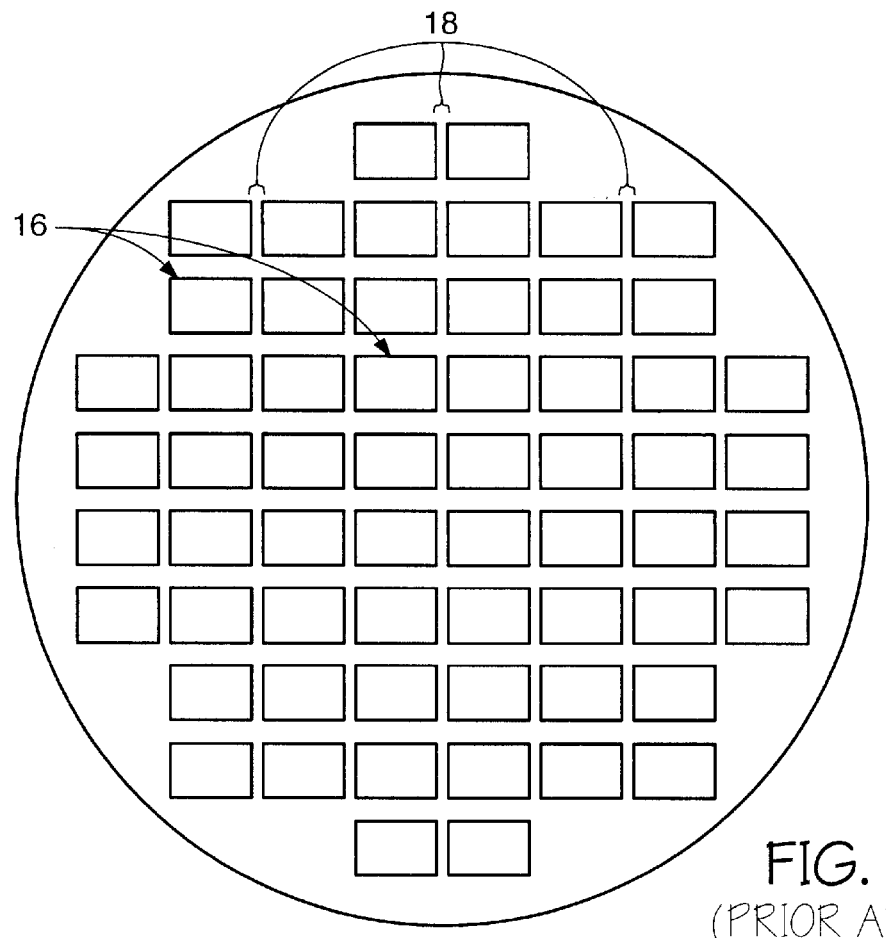
FIG. 1 is a top view of a semiconductor wafer with dies formed thereon as is known in the art.
Figure 2:
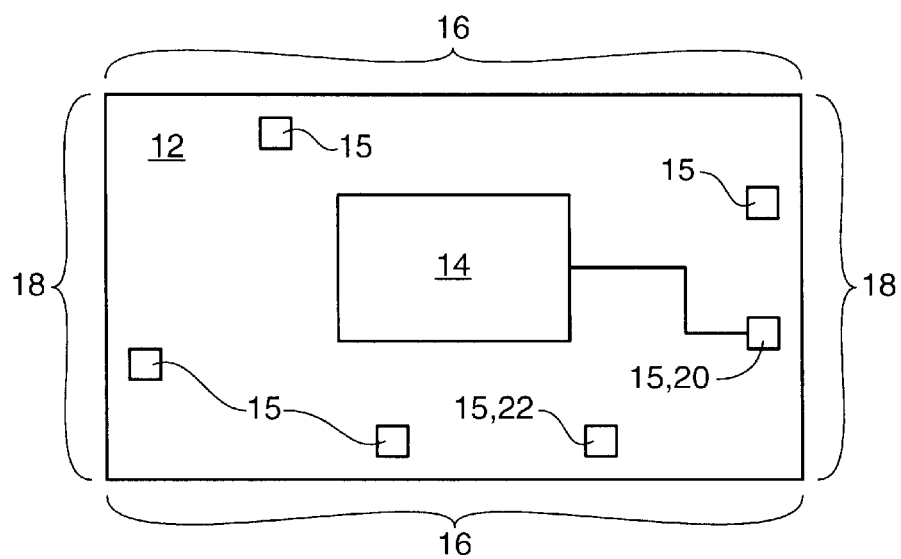
FIG. 2 is a top view of a die of FIG. 1.
Figure 3:
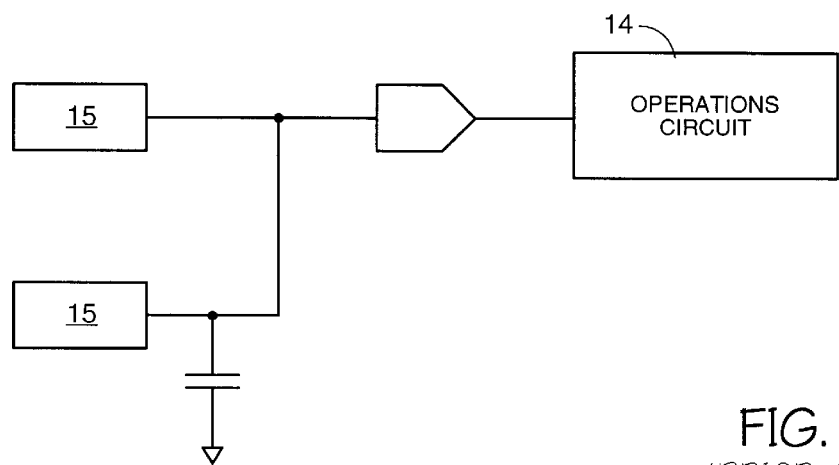
FIG. 3 is a block diagram demonstrating a solution in the prior art for testing the circuitry on a die.
Figure 4:
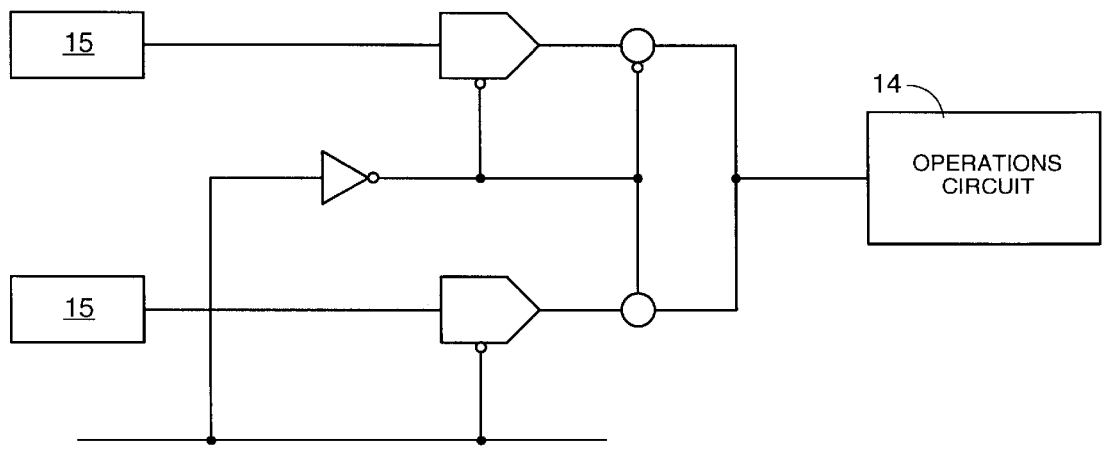
FIG. 4 is a block diagram demonstrating a second such solution in the prior art.

FIG. 2 illustrates the top view of a die 12 that is formed in a conventional manner on a wafer. For purposes of clarity, the wafer and additional dies that may be formed on that wafer have been omitted from FIG. 2. The sides of die 12 contain input bond pads 15, to which external lead wires can be bonded. The bond pads 15 connect to operations circuits 14, such as row address or decoding circuits, within the die 12. It is understood in the art that a die could contain many such bond pads 15 and operations circuits 14. Duplication of these elements has been limited in FIG. 2 for purposes of clarity. Some bond pads 15 are more easily accessible by testing devices than are others. One element 9 accessibility is the spacing between dies 12. For purposes of distinguishing the accessibility of bond pads as illustrated in FIG. 1, areas where the bond pads are more easily accessible are labeled "16," whereas areas where bond pads are relatively inaccessible are denoted by "18."

Occasionally, a particular die 12 is configured so that, during a normal operations mode, an operations circuit 14 is connected to an input bond pad 20 that is in an inaccessible area 18 concerning testing devices. Given such inaccessibility, it can be difficult to apply signals to the operations circuit 14 during a test mode. This is particularly true during the probe of dies that are still part of a wafer. Through the current invention, however, a probe bond pad 22 in an accessible area 16 can be connected to the operations circuit 14 during the test mode, thereby allowing for easy testing.

Figure 5A:
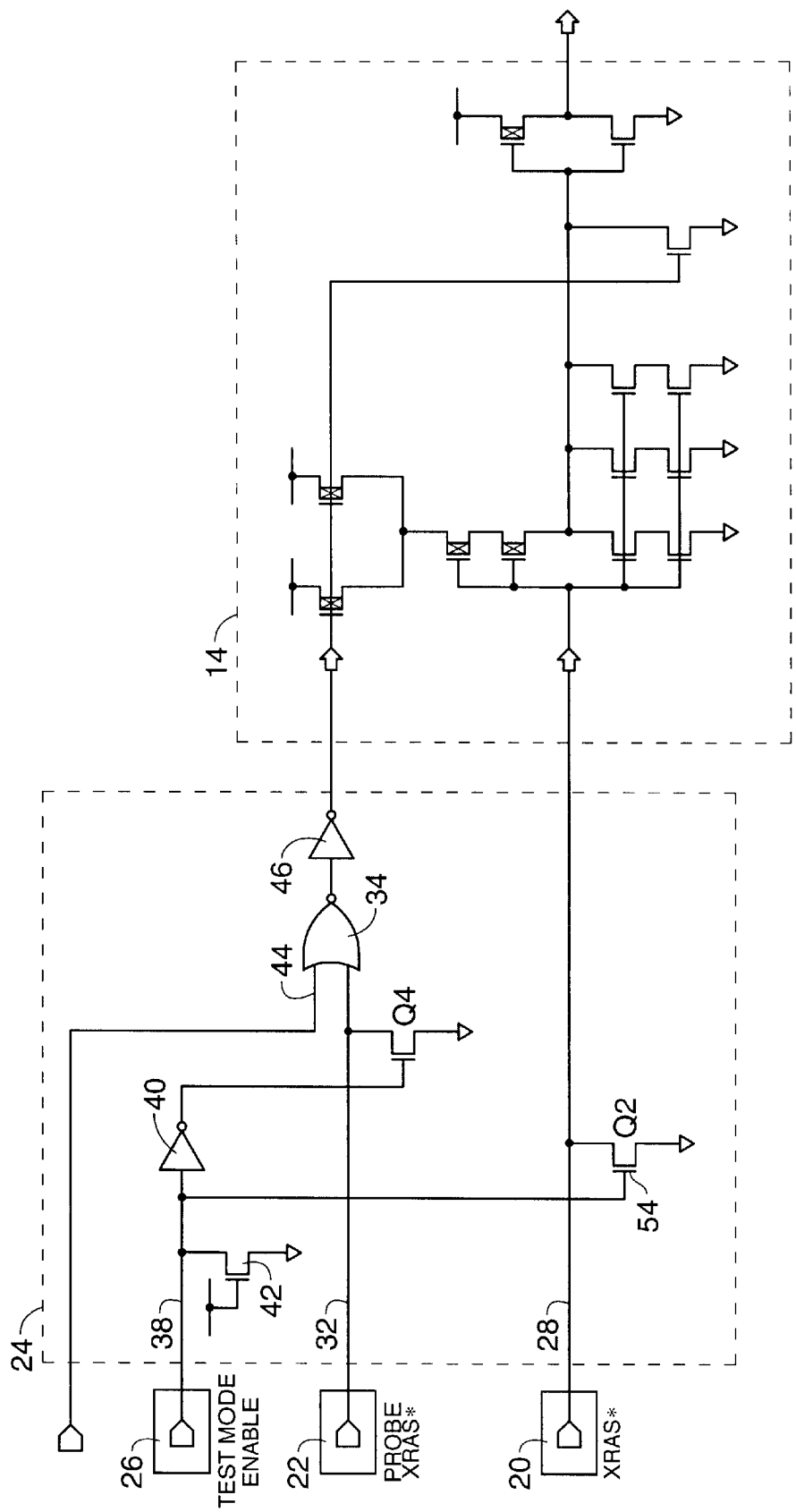
FIG. 5a is a schematic diagram of one exemplary embodiment in accordance with the present invention.

An exemplary testing circuit 24, described below in detail and ill in FIG. 5a, is used to connect the probe pad 22 to the operations circuit 14 during the test mode for that circuit The operation of the testing circuit 24 is controlled by an enable signal. In the preferred embodiment, this signal is provided by the testing device through a Test Mode Enable bond pad 26. Thus, during the test mode, the testing device transmits the enable signal by way of the Test Mode Enable bond pad 26. In response, the testing circuit 24 couples the probe bond pad 22 to the operations circuit 14, which is normally driven by signals applied to input bond pad 20.

Figure 5B:
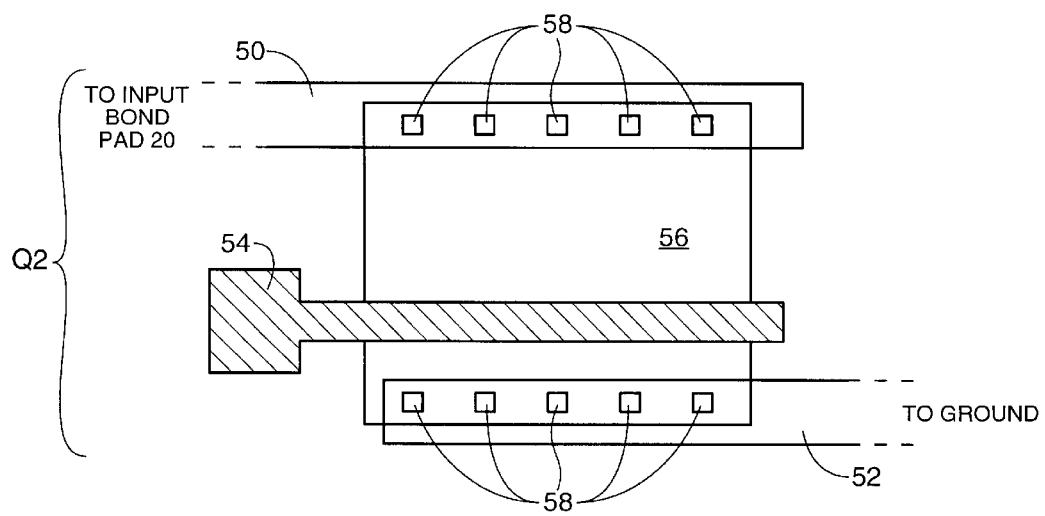
FIG. 5b is an top-down view of a transistor configured for protection against electrostatic discharge.

FIG. 5a is a schematic diagram of one embodiment of the testing circuit 24. The testing circuit 24 contains a first conducting path 28 from the input bond pad 20 to the operations circuit 14. The first conducting path 28 is also coupled to the drain of a first n-channel transistor Q2, which has a source coupled to ground. This first n-channel transistor Q2 is also configured for electrostatic discharge (ESD) protection, as illustrated in FIG. 5b. As with standard transistors of this type, the first n-channel transistor Q2 is comprised of a first conductive strip 50, which, in this case, leads to the first conducting path 28 and, ultimately, to input bond pad 20. A second conductive strip 52 leads to ground, and a gate 54 is interposed between the first and second conductive strips 50 and 52. Further, there exists an n+ active area 56 between the gate 54 and the first conductive strip 50. This n+ active area 56 is preferably in a vertical arrangement with said first conductive strip 50 and communicates with that strip 50 via a series of contacts 58. Unlike standard transistors, this n+ active area 56 is sufficiently large enough to create a relatively high active area resistance, generally around 1K$\Omega$, thereby preventing ESD damage.

Returning to FIG. 5a, a second conducting path 32 connects the probe bond pad 22 with a NOR gate 34. The second conducting path 32 is also coupled to the drain of a second n-channel transistor Q4. A third conducting path 38 couples the Test Mode Enable bond pad 26 with a first inverter 40. Between these two devices, however, the third conducting path 38 is also coupled with the gate 54 of the fist n-channel transistor Q2 as well as a low-bleed current device, known to those skilled in the art as a long L device 42. The first inverter 40 has an input coupled to the third conducting path 38 and an output coupled to the gate of the second n-channel transistor Q4. The NOR gate 34 has a first input 44, which receives an enabling signal for the operations circuit 14. The NOR gate 34 also has a second input coupled to the second conducting path 32, and an output. Finally, the circuit contains a second inverter 46, which has an input coupled to the output of the NOR gate 34. The output of the second inverter 46 is coupled with the operations circuit 14.

Figure 5C:
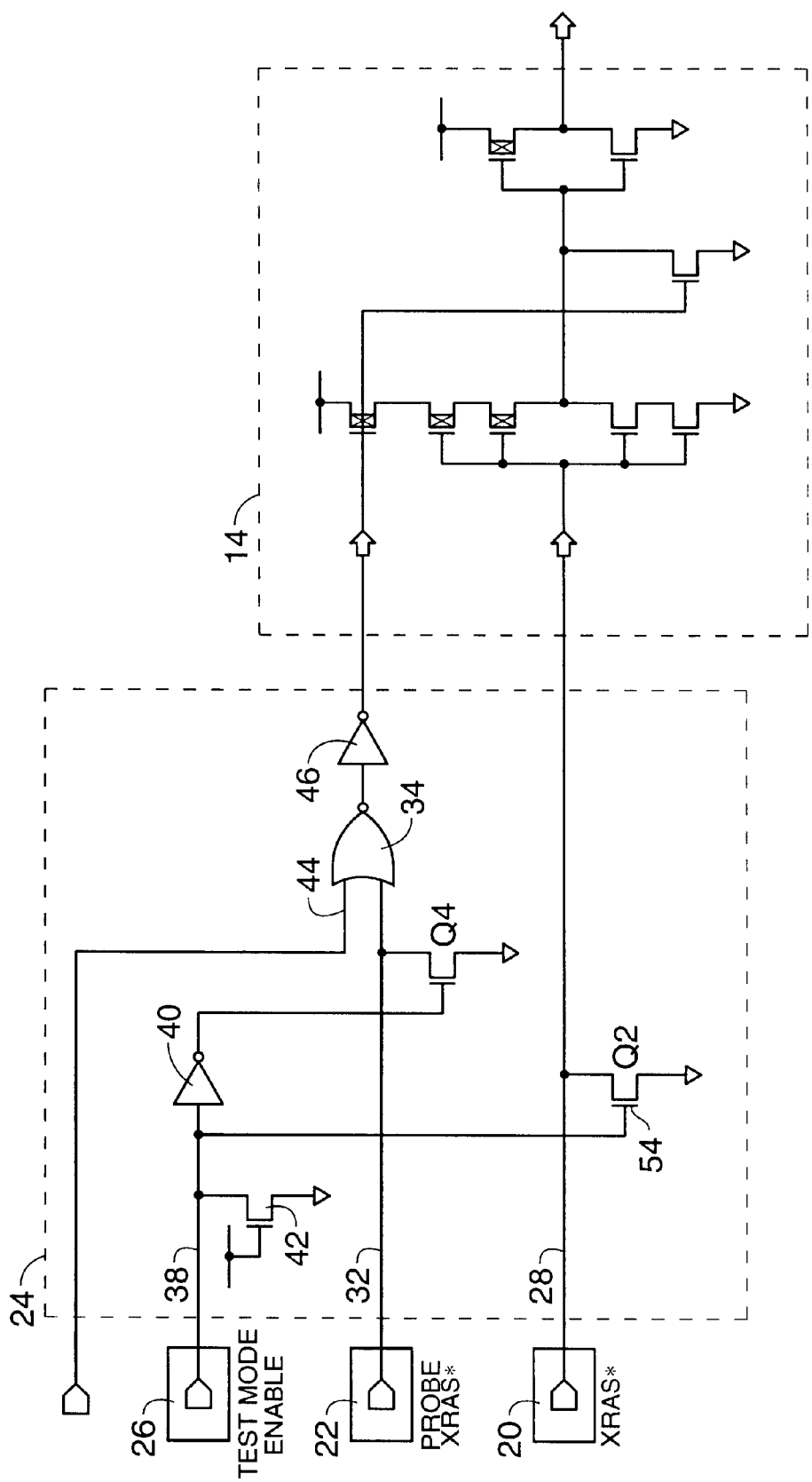
FIG. 5c is a schematic diagram of the exemplary embodiment of FIG. 5a as used with a modified operations circuit.

During normal use of the operations circuit 14, the Test Mode Enable bond pad 26 is not receiving an enabling signal from any testing device. Therefore, the long L device 42 serves to bleed to ground any remaining low current within the third conducing path 38. The lack of current in the third conducting path 38 turns off the first n-channel transistor Q2. With the first n-channel transistor Q2 off, the first conducting path 28 may freely transmit signals from the input bond pad 20 to the operations circuit 14. In the schematic illustrated in FIG. 5a, the signal transmitted by the input bond pad 20 is an external Row Address Strobe (XRAS*) signal. Further, operations circuit 14 is an input buffer which accepts the industry standard input levels of the transmitted XRAS* a and modifies them to internal $V_{cc}$ and ground levels. It is known that such a circuit may have different configurations. The operations circuit in FIG. 5c demonstrates an alternate configuration, wherein optional transistors have been omitted, including those used for further tuning the XRAS* signal.

Returning to the third conducting path 38, the lack of current in that path results in a logic 0 value transmitted to the first inverter 40. It follows that the output of the first inverter is at logic 1, which turns on the second n-channel transistor Q4. Once activated, the second n-channel transistor Q4 bleeds current from the second conducting path 32, thereby grounding any signals from probe bond pad 22.

Because the second conducting path 32 is at logic 0 during normal operations mode, the signal reaching the operations circuit 14 from the second inverted 46 will match the control logic signals received by the first input 44 of the NOR gate 34. For example, given a logic 1 value received by the first input 44 and the logic 0 of the second input, the output of the NOR gate will be a logic 0, which will be inverted by the second inverter 46 to logic 1. This logic 1 will serve as an input for the operations circuit 14. If on the other hand, the first input 44 receives a logic 0, the two logic 0 inputs for the NOR gate 34 result in a logic 1 output, which is inverted by the second inverter to result in a logic 0 being input into the operations circuit 14.

During the test mode of the operations circuit 14, the Test Mode Enable bond pad 26 is driven with a sufficient voltage to overcome the bleeding effects of the long L device 42 and send a signal of logic 1 to the third conducting path 38. This signal turns on the first n-channel transistor Q2, thereby grounding any input signal that would come from the input bond pad 20. The logic 1 signal of the third conducting path 38 also goes through the first inverter 40. The resulting logic 0 value turns off the second n-channel transistor Q4 that had been grounding signals from the probe bond pad 22. As a result, signals such as XRAS* that once issued from the input bond pad 20 may now be using the more accessible probe bond pad 22. The NOR gate 34 receives both a signal enabling the operations circuit 14 as well as transmissions from the probe bond pad 22. The NOR gate 34 output is inverted by the second inverter 46, and the result is entered into the operations circuit 14.

Figure 6A:
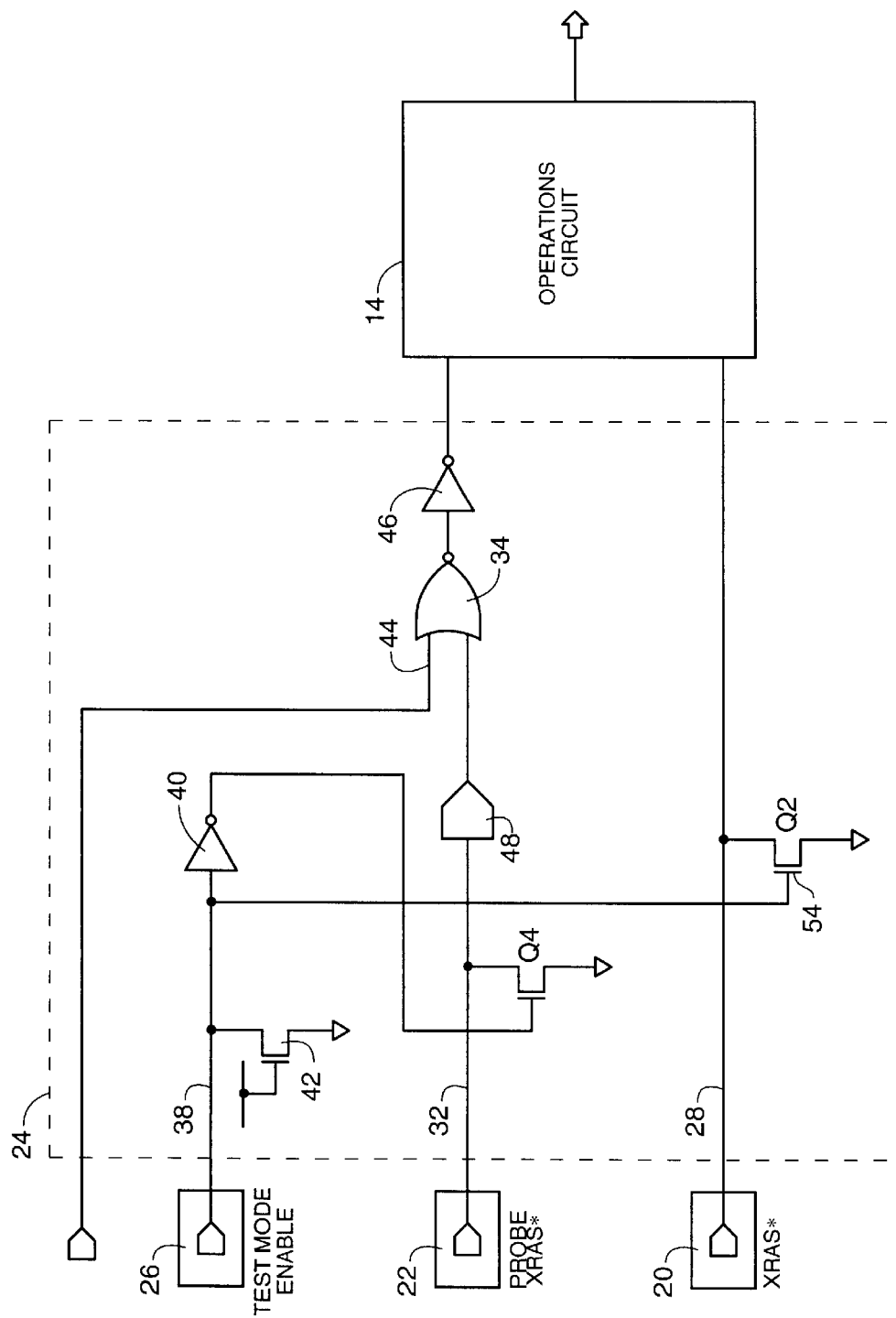
FIG. 6a is a schematic diagram of a second exemplary embodiment of the present invention.
Figure 6B:
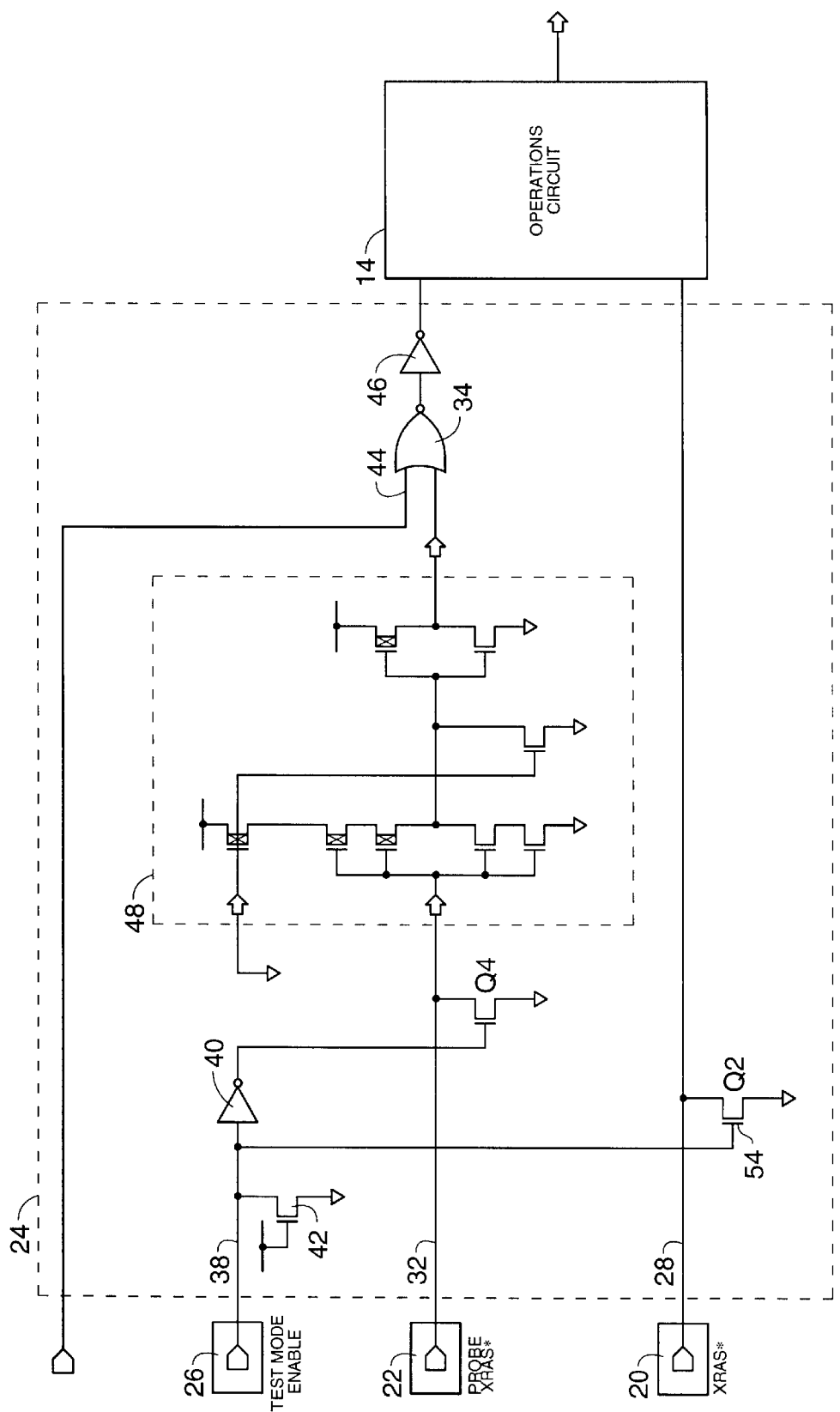

In another embodiment illustrated in FIGS. 6a and 6b, a second input buffer 48 may be used with the probe bond pad 22 in order to preserve a trip point equivalent to that of other bond pads 15. In this embodiment, the second input buffer 48 has a configuration similar to that of the operations circuit 14 of FIG. 5c.

Figure 7:
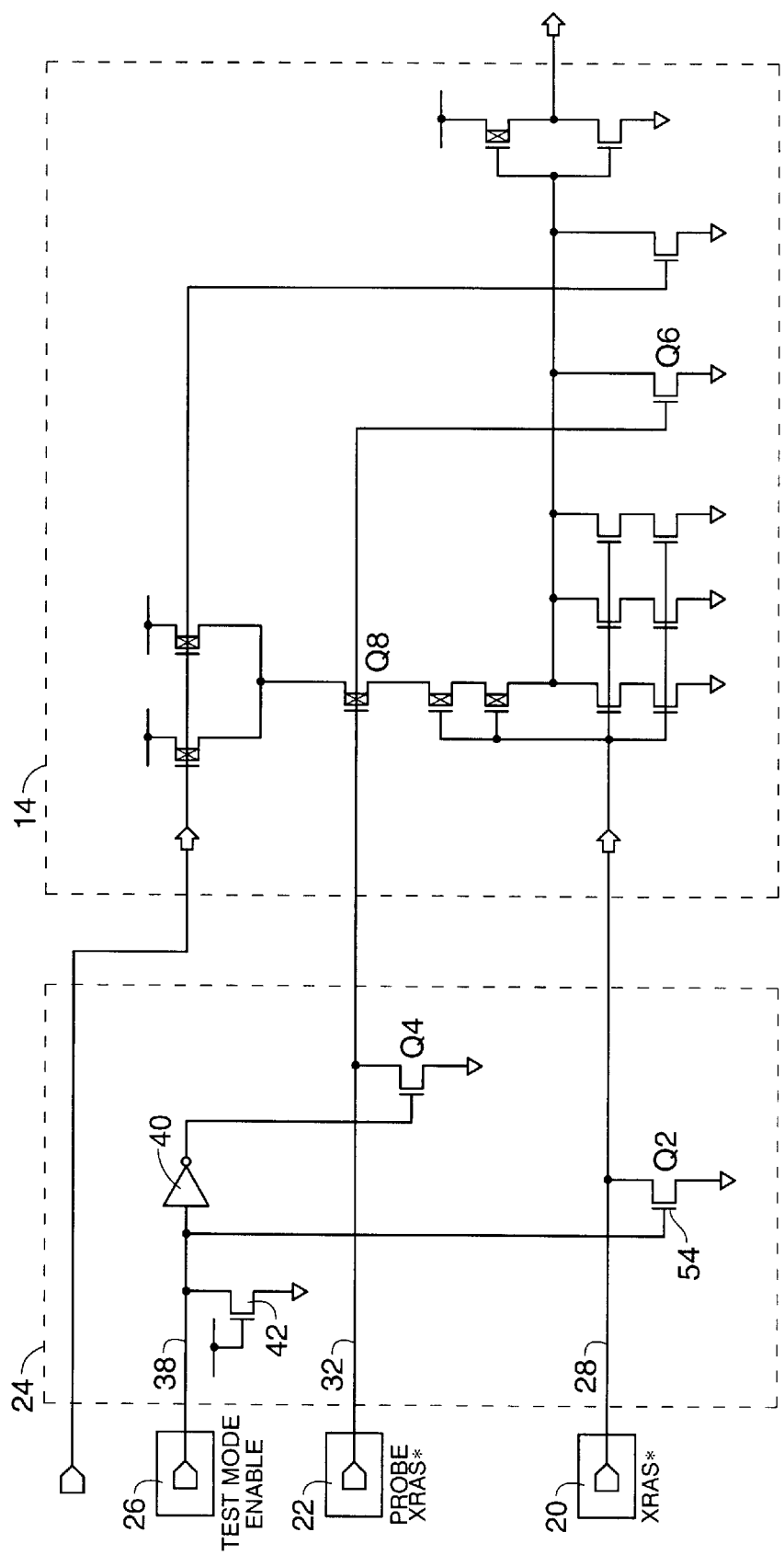
FIG. 7 is a schematic diagram of a third exemplary embodiment of the present invention.

In a third embodiment, shown in FIG. 7, the signals that passed through the NOR gate 34 and the second inverter 46 in earlier embodiments are instead coupled directly into the operations circuit 14 with the addition of one n-channel transistor Q6 and one p-channel transistor Q8. This embodiment has the benefit of allowing multiple points of access for test signals, rather than requiring all of the test signals to be input at only one location. This is not the most preferred embodiment, however, as the additional transistors Q6 and Q8 require additional die space.

One of ordinary skill in the art can appreciate that, although specific embodiments of this invention have been described above for purposes of illustration, various modifications may be made without departing from the spirit and scope of the invention. For example, the testing circuit could be modified so that a single Test Mode Enable pad could enable a plurality of probe bond pads, while simultaneously grounding the corresponding input bond pads. It is also possible to configure the testing circuit to provide for probe bond pads for measuring the output of an operations circuit in the event the output bond pad is inaccessible. In addition, exemplary embodiments within the scope of the current invention are not limited to those involved with inaccessible or redundant bond pads. Rather, the current invention includes within its scope embodiments addressing components including, but not limited to, an access point; an input; a terminal; a pad in general, including one not limited to bondingl and a contact pad. Further, exemplary embodiments within the scope of the current invention are not limited to those involved with a long L device. Rather, the current invention includes within its scope embodiments addressing components and acts for electrically grounding, as well as others. Accordingly, the invention is not limited except as stated in the claims.

What is claimed is:

1. Circuitry for an operations circuit, comprising:
   a first conductive line configured to carry a signal to said operations circuit, said first conductive line being selectively coupled to ground;
   a second conductive line configured to carry said signal to said operations circuit, said second conductive line being selectively coupled to ground;
   a test mode enable path subject to a grounding bias and configured to selectively ground said first conductive line and said second conductive line depending on a voltage present at said test mode enable path;
   a first transistor coupled to said first conductive line, ground, and said test mode enable path;
   a second transistor coupled to said second conductive line, ground, and said test mode enable path; and
   a third transistor coupled to said test mode enable path, ground, and to a constant voltage source distinct from ground, wherein said third transistor is a long L device.

2. The electrical communication circuitry in claim 1, wherein said test mode enable path is configured to activate said first transistor in response to having a first voltage sufficient to overcome said grounding bias.

3. The electrical communication circuitry in claim 2, wherein said test mode enable path is configured to activate said second transistor in response to having a second voltage insufficient to overcome said grounding bias.

4. An electrical circuit configured to electrically select either an accessible test bond pad or an operational inaccessible bond pad using three transistors, wherein one of said three transistors is a long L device.

5. A circuit, comprising:
   a first conductive line configured to transmit a signal, said first conductive line being selectively coupled to ground;
   a second conductive line configured to transmit said signal, said second conductive line being selectively coupled to ground and configured to couple to a redundant bond pad;
   a test mode enable path subject to a grounding bias and configured to selectively ground said first conductive line and said second conductive line depending on a voltage present at said test mode enable path;
   a first transistor coupled to said first conductive line, ground, and said test mode enable path;
   a second transistor coupled to said second conductive line, ground, and said test mode enable path; and
   a long L device coupled to said test mode enable path, ground, and to a constant voltage source distinct from ground, wherein said long L device is configured for probing said redundant bond path.

6. Circuitry for an operations circuit, comprising:
   a first conductive line;
   a first transistor;
   a second conductive line;
   a second transistor;
   a test mode enable path subject to a grounding bias; and
   a long L device configured with said first transistor and said second transistor to make a selection between one of said first conductive line and said second conductive line by said test mode enable path overcoming said grounding bias.

7. The circuitry in claim 6, wherein:
   said first transistor is coupled to said first conductive line and to said test mode enable path;
   said second transistor is coupled to said second conductive line and to said test mode enable path; and
   said long L device is coupled to said test mode enable path.

8. A method of configuring circuitry, comprising:
   providing a first conductive line and a second conductive line;
   defining a configuration with a long l device and two transistors; and
   with said configuration, selecting between one of said first conductive line and said second conductive line.

9. The method in claim 8, wherein said act of selecting comprises:
   providing a test mode enable path subject to a grounding bias;
   coupling said test mode enable path to said configuration; and
   overcoming said grounding bias with said test mode enable path.

10. The method in claim 9, wherein said act of defining a configuration comprises coupling said first conductive line, said second conductive line, sand said long l device together.

11. The method in claim 10, wherein said act of coupling said test mode enable path to said configuration comprises coupling said test mode enable path to said first conductive line, said second conductive line, and said long l device.

* * * * *

UNITED STATES PATENT AND TRADEMARK OFFICE
CERTIFICATE OF CORRECTION

PATENT NO. : 6,600,359 B1
DATED : July 29, 2003
INVENTOR(S) : Troy Manning

It is certified that error appears in the above-identified patent and that said Letters Patent is hereby corrected as shown below:

Title page,
Item [54], delete the title "CIRCUIT HAVING A LONG DEVICE CONFIGURED FOR TESTING" and replace it with -- A CIRCUIT AND METHOD FOR CONFIGURING A REDUNDANT BOND PAD FOR PROBING A SEMICONDUCTOR --.
Item [57], ABSTRACT,
Line 9, delete "bon" and replace it with -- bond --;
Line 11, add -- redundant -- before "bond."

Column 1,
Line 58, add a period -- . -- after the term "equipment";
Line 60, add a period -- . -- after the term "tested."

Column 2,
Line 40, delete the number "9" and replace it with the term -- affecting --;
Line 58, delete "ill" and replace it with the term -- illustrated --.

Column 3,
Line 29, delete "fist" and replace it with the term -- first --;
Line 46, delete "conducing" and replace it with the term -- conducting --;
Line 54, delete "a" and replace it with the term -- signal --.

Column 4,
Line 3, delete "inverted" and replace it with the term -- inverter --;
Line 9, add a comma -- , -- after the term "If"
Line 25, add -- input -- after the term "be";
Line 64, delete "bondingl" and replace it with -- bonding; --.

UNITED STATES PATENT AND TRADEMARK OFFICE
CERTIFICATE OF CORRECTION

PATENT NO. : 6,600,359 B1
DATED : July 29, 2003
INVENTOR(S) : Troy Manning

It is certified that error appears in the above-identified patent and that said Letters Patent is hereby corrected as shown below:

Column 6,
Line 44, delete "sand" and replace it with -- and --.

Signed and Sealed this

Thirteenth Day of April, 2004

JON W. DUDAS
*Acting Director of the United States Patent and Trademark Office*